(12) United States Patent
Koide et al.

(10) Patent No.: US 10,321,074 B2
(45) Date of Patent: Jun. 11, 2019

(54) IMAGING DEVICE, ELECTRONIC APPARATUS, AND IMAGING METHOD

(71) Applicant: Seiko Epson Corporation, Tokyo (JP)

(72) Inventors: Yasunori Koide, Matsumoto (JP); Mitsutoshi Miyasaka, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/182,942

(22) Filed: Nov. 7, 2018

(65) Prior Publication Data

US 2019/0075260 A1 Mar. 7, 2019

Related U.S. Application Data

(62) Division of application No. 15/342,656, filed on Nov. 3, 2016, now Pat. No. 10,154,212.

(30) Foreign Application Priority Data

Nov. 20, 2015 (JP) ................. 2015-227721

(51) Int. Cl.
*H04N 5/378* (2011.01)
*H04N 5/357* (2011.01)
*H04N 5/359* (2011.01)
*H04N 5/3745* (2011.01)
*H01L 27/146* (2006.01)

(52) U.S. Cl.
CPC ....... *H04N 5/359* (2013.01); *H01L 27/14612* (2013.01); *H04N 5/357* (2013.01); *H04N 5/378* (2013.01); *H04N 5/3745* (2013.01)

(58) Field of Classification Search
CPC ........ H04N 5/359; H04N 5/357; H04N 5/378; H01L 27/14612; H01L 29/7869; H01L 27/14627
See application file for complete search history.

(56) References Cited

U.S. PATENT DOCUMENTS

| | | | |
|---|---|---|---|
| 5,296,696 A | 3/1994 | Uno | |
| 2003/0090584 A1* | 5/2003 | Goto | H01L 27/14603 348/299 |
| 2005/0253944 A1* | 11/2005 | Olsen | H04N 5/2352 348/297 |
| 2007/0145239 A1 | 6/2007 | Mheen et al. | |
| 2012/0120300 A1 | 5/2012 | Dai | |
| 2016/0293654 A1 | 10/2016 | Tomekawa et al. | |
| 2017/0302870 A1* | 10/2017 | Ikuma | H04N 5/357 |
| 2017/0359537 A1 | 12/2017 | Sakano et al. | |
| 2018/0039882 A1 | 2/2018 | Ikeda et al. | |
| 2018/0376092 A1* | 12/2018 | Suzuki | H04N 5/378 |

FOREIGN PATENT DOCUMENTS

JP 2006-216643 A 8/2006

* cited by examiner

*Primary Examiner* — Hung H Lam
(74) *Attorney, Agent, or Firm* — Harness, Dickey & Pierce, P.L.C.

(57) ABSTRACT

An imaging device includes a photodiode having a first electrode and a second electrode, a first transistor that controls electrical connection between the first electrode and a first wiring line through which first voltage is supplied, and a second transistor that controls electrical connection between the first electrode and a second wiring line through which second voltage different from the first voltage is supplied, and voltage at the second electrode is read with the first transistor and the second transistor turned off.

18 Claims, 4 Drawing Sheets

IMAGING DEVICE, ELECTRONIC APPARATUS, AND IMAGING METHOD

CROSS-REFERENCE TO RELATED APPLICATIONS

This application is a divisional of U.S. patent application Ser. No. 15/342,565, filed Nov. 3, 2016, which claims priority to Japanese Patent Application No. 2015-227721, filed Nov. 20, 2015, both of which are hereby expressly incorporated by reference herein in their entireties.

BACKGROUND

1. Technical Field

The present invention relates to an imaging device using photodiodes, an electronic apparatus including the imaging device, and an imaging method using the imaging device.

2. Related Art

In a photodiode used in an imaging device, electric charge according to the amount of received light is excited during a light exposure period. In the imaging device, however, after the light exposure but before the voltage across the photodiode is read, leak current flows in the direction from the N-type impurity layer of the photodiode toward the P-type impurity layer thereof (reverse direction), and the electric charge excited in the photodiode therefore decreases. It is therefore undesirably difficult to accurately detect the amount of light received with the photodiode.

To solve the problem, JP-A-2006-216643 discloses an imaging device including a photodiode in which electric charge according to the amount of received light is excited, an amplification transistor that produces an imaging signal according to the voltage at the cathode of the photodiode, and a leak current cancellation diode connected to the cathode of the photodiode. In the imaging device, in the period for which leak current flows from the cathode of the photodiode to the anode thereof, leak current flows into the cathode of the photodiode via the leak current cancellation diode to replenish the electric charge lost due to the leak current in the photodiode.

In the technology disclosed in JP-A-2006-216643, the electric charge lost from the photodiode due to the leak current is replenished by the leak current from the leak current cancellation diode. It is therefore necessary to set the magnitude of the leak current from the photodiode to be equal to the magnitude of the leak current from the leak current cancellation diode. The characteristics of the photodiode and the leak current cancellation diode, however, vary product to product, and it is therefore difficult to set the magnitude of the leak current from the photodiode to be equal to the magnitude of the leak current from the leak current cancellation diode. Therefore, according to the technology disclosed in JP-A-2006-216643, it is difficult to acquire an imaging signal accurately representing the amount of light received with the photodiode.

SUMMARY

An advantage of some aspects of the invention is to accurately detect the amount of light received with a photodiode.

An aspect of the invention provides an imaging device including photodiodes each having a first electrode and a second electrode, a first transistor that controls electrical connection between the first electrode and a first wiring line through which first voltage is supplied, and a second transistor that controls electrical connection between the first electrode and a second wiring line through which second voltage different from the first voltage is supplied, and voltage at the second electrode is read with the first transistor and the second transistor turned off.

According to the aspect of the invention, the first transistor and the second transistor are turned off to disconnect a current path through which leak current from the corresponding photodiode flows. Therefore, reading the voltage at the second electrode of the photodiode with the first transistor and the second transistor turned off allows accurate detection of the amount of light received with the photodiode.

In a preferable aspect of the invention, a gate of the first transistor is connected to a rest line, a gate of the second transistor is connected to a light exposure line, voltage that turns on the first transistor is outputted to the reset line and voltage that turns off the second transistor is outputted to the light exposure line to initialize the corresponding photodiode, voltage that turns off the first transistor is outputted to the reset line and voltage that turns on the second transistor is outputted to the light exposure line to excite electric charge according to an amount of received light in the corresponding photodiode, and the voltage that turns off the first transistor is outputted to the reset line and the voltage that turns off the second transistor is outputted to the light exposure line to read the voltage at the second electrode.

In the configuration described above, the imaging device turns on or off each of the first transistor and the second transistor to initialize the corresponding photodiode, excite electric charge according to the amount of received light, and read the voltage at the second electrode. The imaging device according to the preferable aspect of the invention can therefore accurately detect the amount of light received with the photodiode.

In a preferable aspect of the invention, the imaging device further includes a capacitance element interposed between the second electrode and the second wiring line.

In the configuration described above, since the capacitance element is interposed between the second electrode and the second wiring line, the electric charge excited in accordance with the amount of light received with the corresponding photodiode can be determined from the electric charge charged in the capacitance element. The amount of light received with the photodiode can therefore be accurately detected.

In a preferable aspect of the invention, the imaging device further includes a third transistor that amplifies the voltage at the second electrode and outputs the amplified voltage and a fourth transistor that controls whether or not an output from the third transistor is allowed in accordance with voltage supplied from a selection line to a gate of the fourth transistor.

In the configuration described above, since the third transistor amplifies the voltage at the second electrode and outputs the amplified voltage, the amount of light received with the corresponding photodiode can be more accurately detected. Further, since the fourth transistor controls whether or not an output from the third transistor is allowed in accordance with voltage supplied from a selection line to the gate of the fourth transistor, the amount of light received with the photodiode can be more accurately detected for each of the fourth transistors connected to the selection lines.

In the present application, the state in which an element A and an element B are electrically connected to each other means that the element A and the element B can be so set as to have the same logical state (voltage in design concept). Specifically, the state in which the element A and the element B are electrically connected to each other includes not only a state in which the element A and the element B are directly connected to each other via a wiring line but also a state in which the element A and the element B are indirectly connected to each other via a resistive element, a switching element, or any other electrical element. That is, the state of the element A and the element B can be taken as the electrically connected state even in a case where the voltage across the element A and the voltage across the element B slightly differ from each other but the voltages are handled as the same logic in a circuit. Therefore, for example, in a state in which the first transistor is kept on, the state in which the first electrode of the corresponding photodiode is electrically connected to the first wiring line is achieved.

The imaging device according to each of the aspects described above is used in a variety of electronic apparatus. A typical example of the electronic apparatus is a video apparatus that captures images (still images and video images) of a subject, and the imaging device according to each of the aspects described above is further preferably used, for example, in a biological information measurement apparatus that captures an image of a vein in a biological body to measure biological information.

Another aspect of the invention provides an imaging method using an imaging device including photodiodes each having a first electrode and a second electrode, a first transistor that controls electrical connection between the first electrode and a first wiring line through which first voltage is supplied, and a second transistor that controls electrical connection between the first electrode and a second wiring line through which second voltage different from the first voltage is supplied, the method including reading voltage at the second electrode with the first transistor and the second transistor turned off.

In a preferable aspect of the invention, in the imaging device, a gate of the first transistor is connected to a rest line, and a gate of the second transistor is connected to a light exposure line, and the imaging method further includes outputting voltage that turns on the first transistor to the reset line and outputting voltage that turns off the second transistor to the light exposure line to initialize the corresponding photodiode, outputting voltage that turns off the first transistor to the reset line and outputting voltage that turns on the second transistor to the light exposure line to excite electric charge according to an amount of received light in the corresponding photodiode, and outputting the voltage that turns off the first transistor to the reset line and outputting the voltage that turns off the second transistor to the light exposure line to read the voltage at the second electrode.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

A: Configuration

Figure 1:
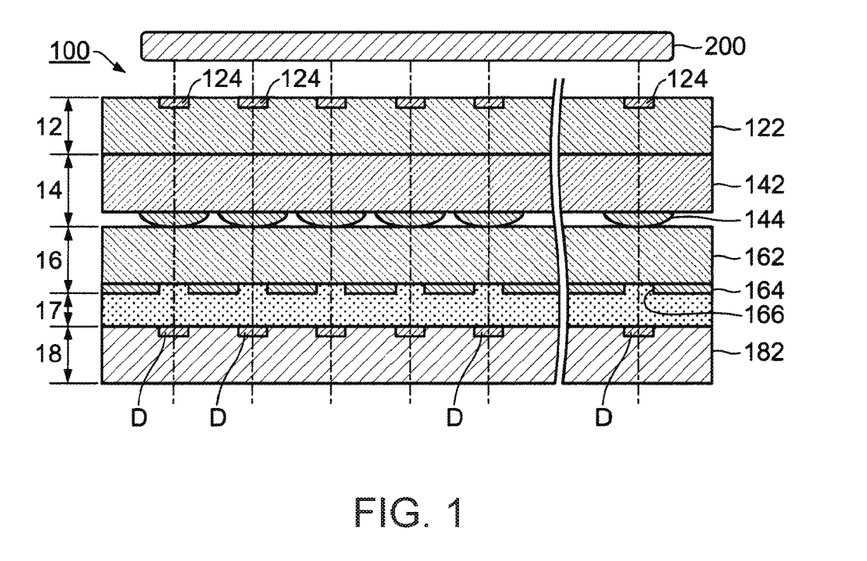
FIG. 1 is a cross-sectional view of an imaging system including an imaging device according to a first embodiment.

FIG. 1 shows the configuration view of an imaging system 100 including an imaging device 18 according to a first embodiment of the invention. The imaging system 100 is an electronic apparatus that captures an image of a subject 200 and includes an illuminator 12, a light collector 14, a light blocker 16, and the imaging device 18 according to the present embodiment, as shown in FIG. 1. The illuminator 12, the light collector 14, and the light blocker 16 are disposed on the imaging device 18. The light collector 14 is located between the illuminator 12 and the light blocker 16, and the light blocker 16 is located between the light collector 14 and the imaging device 18. The light blocker 16 and the imaging device 18 are bonded to each other by using a light transmissive adhesive 17. The imaging system 100 is used in a biological information measurement apparatus that measures biological information, for example, the degree of oxygen saturation and the blood sugar level, and captures an image of a vein in an examinee's hand or finger as an image of the subject 200.

The illuminator 12 includes a light transmissive substrate 122 and a plurality of light emitting devices 124, as shown in FIG. 1. The plurality of light emitting devices 124 are formed in the substrate 122, specifically, in the surface thereof facing away from the light collector 14 and emit illumination light of a specific wavelength with which the subject 200 is illuminated. For example, the plurality of light emitting devices 124 irradiate the subject 200 with infrared light (having wavelength longer than or equal to 700 nm but shorter than or equal to 900 nm) as the illumination light. The infrared light passes through biological tissue of the subject 200 and is partially absorbed by reduced hemoglobin in the blood in the vein. Out of the infrared light having passed through the biological tissue of the subject 200, infrared light that has not been absorbed by the reduced hemoglobin is reflected as imaged light off the biological tissue toward the illuminator 12. The subject 200 can instead be illuminated from the side opposite the imaging device 18 with respect to the subject 200.

The light collector 14 is an element that collects the imaged light coming from the subject 200 and includes a light transmissive substrate 142 and a plurality of lenses 144. Each of the plurality of lenses 144 is formed on the substrate 142, specifically, on the surface thereof facing the light blocker 16 and is a convex lens that collects the imaged light from the subject 200. The light blocker 16 includes a light transmissive substrate 162 and a light blocking layer 164. The light blocking layer 164 is a light blocking thin film formed on the substrate 162, specifically, on the surface thereof facing the imaging device 18. A plurality of openings 166, through which light fluxes having exited out of the discrete lenses 144, are formed in the light blocking layer 164.

The imaging device 18 captures the imaged light having originated from the subject 200 and passed through the illuminator 12, the light collector 14, and the light blocker 16. The imaging device 18 in the first embodiment is a solid-state imaging device in which a plurality of unit circuits U (not shown in FIG. 1), which include photodiodes D corresponding to the discrete lenses 144, are arranged in a surface of a substrate 182. The substrate 182 is made, for example, of a semiconductor material.

Figure 2:
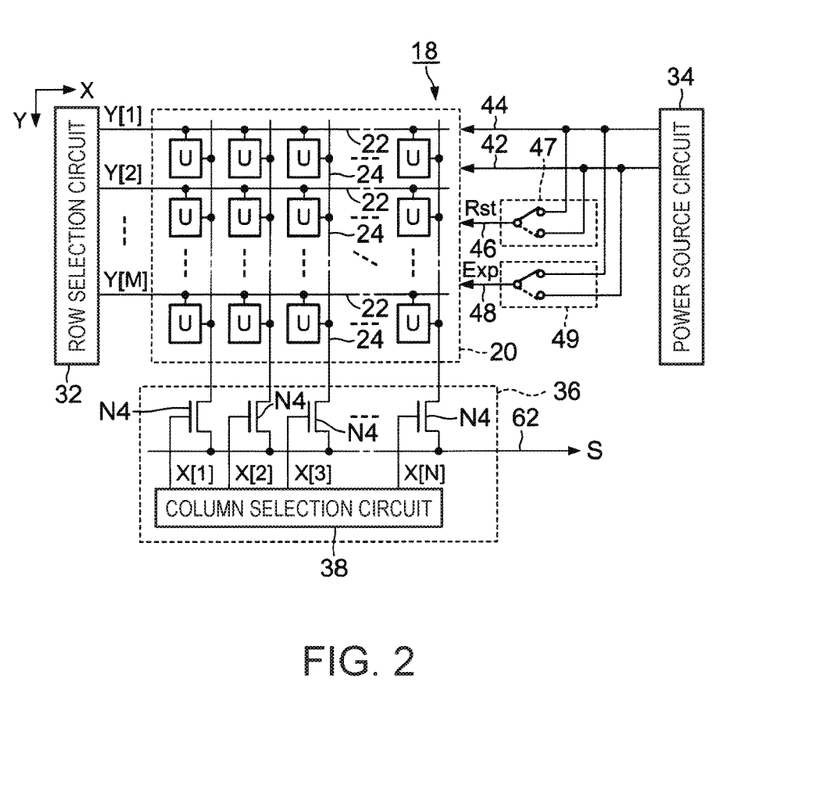
FIG. 2 shows an electrical configuration view of an imaging device.

FIG. 2 shows an electrical configuration of the imaging device 18. The imaging device 18 according to the first embodiment includes an imaging section 20, a row selection circuit 32, a power source circuit 34, a signal output circuit 36, a reset signal generator 47, and a light exposure signal generator 49, as shown in FIG. 2. The power source circuit 34 produces high potential power source voltage Vdd and low potential power source voltage Vss (Vdd>Vss). In this example, the low potential power source voltage Vss is ground voltage. The high potential power source voltage Vdd is supplied to a first power source line 44, the reset signal generator 47, and the light exposure signal generator 49, and the low potential power source voltage Vss is supplied to a second power source line 42, the reset signal generator 47, and the light exposure signal generator 49.

The row selection circuit 32, the power source circuit 34, the signal output circuit 36, the reset signal generator 47, and the light exposure signal generator 49 in FIG. 2 function as a drive circuit for driving the imaging section 20 to detect the amount of light received with each of the photodiodes D. The reset signal generator 47 includes a switch that selects one of the high potential power source voltage Vdd and the low potential power source voltage Vss supplied from the power source circuit 34 and supplies the selected voltage as a reset signal Rst to a reset line 46. The light exposure signal generator 49 includes a switch that selects one of the high potential power source voltage Vdd and the low potential power source voltage Vss supplied from the power source circuit 34 and supplies the selected voltage as a light exposure signal Exp to a light exposure line 48. Action of outputting the reset signal Rst performed by the reset signal generator 47 and action of outputting the light exposure signal Exp performed by the light exposure signal generator 49 will be clearly described in detail in the description of the action of the imaging system 100.

The imaging section 20 has M selection lines 22, which extend in an X direction, and N detection lines 24, which intersect the selection lines 22 extending in the X direction and extend in a Y direction (M and N are natural numbers). The unit circuits U are disposed in the positions corresponding to the intersections of the selection lines and the detection lines 24. That is, in the imaging section 20, a plurality of unit circuits U are arranged in a matrix formed of M vertically arranged rows and N horizontally arranged columns. Each of the unit circuits U includes a photodiode D (not shown in FIG. 2), in which electric charge according to the amount of received light is excited. Each of the unit circuits U receives the high potential power source voltage Vdd through the first power source light 44, the low potential power source voltage Vss through the second power source light 42, the reset signal Rst through the reset line 46, and the light exposure signal Exp through the light exposure line 48.

In the present embodiment, in accordance with occurrence of an imaging instruction, initialization action of initializing electric charge accumulated in the photodiodes D in all the unit circuits U, light exposure action of exciting electric charge according to the amounts of light received by the photodiodes D in all the unit circuits U, and readout action of reading the amount of the electric charge in the photodiode D in each of the unit circuits U from the unit circuit U are sequentially performed.

The row selection circuit 32 and the signal output circuit 36 are circuits that control the readout action of reading the amount of charge from each of the unit circuits U. In more detail, in each selection period H, the row selection circuit 32 sequentially selects the row of a unit circuit U to be read, sets, among selection signals Y[m] (m=1 to M) outputted to the M selection lines 22, the level of a selection signal to be outputted to the selection line 22 in the selected row at an active level (high level=Vdd in this example), and sets the levels of the selection signals to be outputted to the selection lines 22 in the other rows at an inactive level (low level=Vss in this example).

The signal output circuit 36 includes N transistors N4, which are disposed in the respective columns of the unit circuits U in the imaging section 20, a column selection circuit 38, and one output line 62. The drain of the transistor N4 in an arbitrary n column is connected to the detection line 24 in the n-th column. The sources of the N transistors N4 are connected to the common output line 62. The transistor N4 in the n-th column is a switch that is interposed between the output line 62 and the detection line 24 in the n-th column (n=1 to N) and controls the electrical connection (conduction/isolation) between the output line 62 and the detection line 24. That is, when the transistor N4 in the n-th column is turned on, the detection line 24 in the n-th column is electrically connected to the output line 62. The gates of the N transistors N4 are connected to the column selection circuit 38. The column selection circuit 38 sequentially selects the column of a unit circuit U to be read in the period for which an arbitrary m-th row is selected by the row selection circuit 32 and outputs a control signal X[n] that turns on the transistor N4 in the selected column and turns off the transistors N4 in the other columns. The column selection circuit 38 sets the level of the control signal to be outputted to the selected column at an active level (high level=Vdd in this example) and sets the control signals to be outputted to the other columns at an inactive level (low level=Vss in this example).

Figure 3:
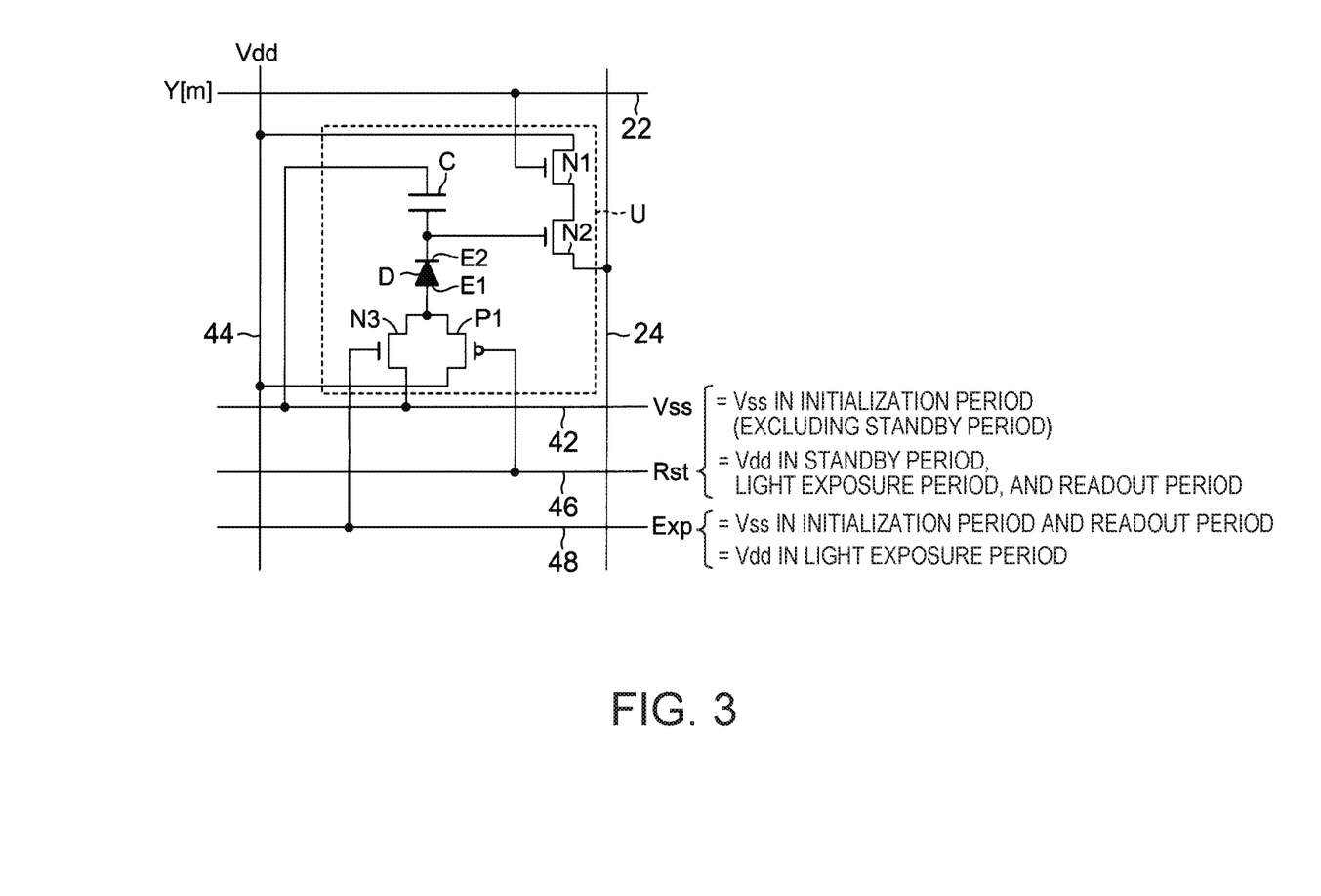
FIG. 3 shows an electrical configuration view of a unit circuit.

FIG. 3 shows an electrical configuration view of a single unit circuit U located in an arbitrary m row and n column in the imaging section 20. Each of the unit circuits U in the first embodiment includes the photodiode D, transistors N1 to N3, a transistor P1, and a capacitive element, as shown in FIG. 3. The photodiode D is a light receiving device in which electric charge according to the amount of received light is excited and has a stacked structure in which a photoelectric conversion layer is stacked between an anode E1, which is a first electrode, and a cathode E2, which is a second electrode. In the photodiode D in the first embodiment, a chalcopyrite photoelectric conversion layer made, for example, of $CuInSe_2$ (CIS) or $Cu(In,Ga)Se_2$ (CIGS) receives the imaged light from the subject 200. A chalcopyrite photoelectric conversion layer has high light reception sensitivity and can therefore readily achieve highly sensitive imaging but has a tendency toward large current leakage (dark current) at the time of no light reception. The same tendency is observed, for example, in a configuration in which the photoelectric conversion layer of the photodiode D is made of polycrystalline or amorphous silicon.

The anode E1 of the photodiode D is connected to the drain of the transistor N3 and the drain of the transistor P1, as shown in FIG. 3. The source of the transistor N3 is connected to the second power source line 42, to which the low potential power source voltage Vss is supplied. The gate of the transistor N3 is connected to the light exposure line 48, to which the light exposure signal Exp is supplied. The transistor N3 is turned on when the light exposure signal Exp becomes a high level (high potential power source voltage Vdd in this example) and electrically connects the anode E1 of the photodiode D to the second power source line 42. The transistor N3, which is a second transistor, is thus interposed between the second power source line 42 and the anode E1 of the photodiode D and functions as a switch that controls the electrical connection (conduction/isolation) between the second power source line 42 and the anode E1 of the photodiode D.

The source of the transistor P1 is connected to the first power source line 44, to which the high potential power source voltage Vdd is supplied. The gate of the transistor P1 is connected to the reset line 46, to which the reset signal Rst is supplied. The transistor P1 is turned on when the reset signal Rst becomes a low level (low potential power source voltage Vss in this example) and electrically connects the anode E1 of the photodiode D to the first power source line 44. The transistor P1, which is the first transistor, is interposed between the first power source line 44 and the anode E1 of the photodiode D and functions as a switch that controls the electrical connection (conduction/isolation) between the first power source line 44 and the anode E1 of the photodiode D.

The capacitive element C has one electrode connected to the cathode E2 of the photodiode D and the other electrode connected to the second power source line 42. The capacitive element C retains the voltage at the cathode E2 of the photodiode D.

The transistor N1 and N2 form an amplification circuit that outputs voltage corresponding to the voltage at the cathode E2 of the photodiode D to the detection line 24. In more detail, the transistor N2 has a gate connected to the cathode E2 of the photodiode D, a source connected to the detection line 24, and a drain connected to the source of the transistor N1. The drain of the transistor N1 is connected to the first power source line 44, and transistor N1 is turned on when the selection signal Y[m], which is given to the gate of the transistor N1 via selection line 22, becomes the high level (high potential power source voltage Vdd in this example) and supplies the high potential power source voltage Vdd to the drain of the transistor N2. The transistor N2 thus functions as a source follower circuit and outputs the voltage at the cathode E2 of the photodiode D from which threshold voltage of the transistor N2 is subtracted to the detection line 24. The transistor N2, which is a third transistor, thus functions as an amplification transistor that amplifies the voltage at the cathode E2 of the photodiode D and outputs the amplified voltage. The transistor N1, which is a fourth transistor, functions as a switch that is interposed between the transistor N2 and the first power source line 44 and controls the electrical connection (conduction/isolation) between the transistor N2 and the first power source line 44. The destination to which the drain of the transistor N1 is connected is not limited to the first power source line 44, to which the high potential power source voltage Vdd is supplied. For example, the transistor N1 can be disposed between a wiring line to which fixed voltage different from the high potential power source voltage Vdd is supplied and the drain of the transistor N2. The fixed voltage that is supplied to the wiring line in this case and is different from the high potential power source voltage Vdd may be produced by an external power source or the power source circuit 34.

B: Action

Figure 4:
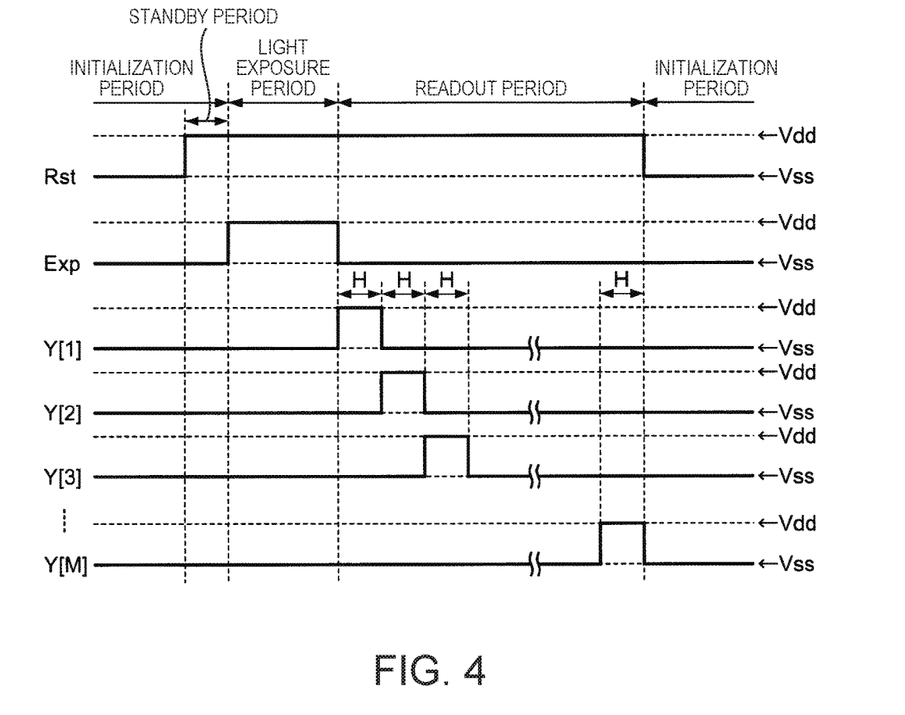
FIG. 4 is a time chart showing the action of the imaging device.

The action of the imaging system 100 will next be described. FIG. 4 is a time chart showing the action of the imaging device 18 according to the present embodiment contained in the imaging system 100. In the imaging device 18, an initialization period (including standby period), a light exposure period, and a readout period sequentially occur, for example, in response to an imaging instruction from a user. The initialization period is formed of a standby period immediately before the light exposure period and a period that occurs before the standby period and has a predetermined time length.

In each of the periods before the readout period, all the selection signals Y[1] to Y[M] are set at the low level, and the transistors N1 of all the unit circuits U are off. Further, in each of the periods before the readout period, all the control signals X[1] to X[N] are set at the low level.

In the initialization period but before the standby period, the low potential power source voltage Vss is supplied as the reset signal Rst to the reset line 46, and the low potential power source voltage Vss is supplied as the light exposure signal Exp to the light exposure line 48. As a result, in each of the unit circuits U of the imaging device 18, the transistor N3 is off, and the transistor P1 is on. Therefore, in each of the unit circuits U, a current path including the first power source line 44→the transistor P1→the photodiode D→the capacitive element C→the second power source line 42 is formed, and current flows through the current path to initialize the photodiode D and charge the capacitive element C.

In the standby period, the high potential power source voltage Vdd is supplied as the reset signal Rst to the reset line 46, and the low potential power source voltage Vss is supplied as the light exposure signal Exp to the light exposure line 48. As a result, in each of the unit circuits U, the transistor N3 and the transistor P1 are off, so that the current path described above is disconnected. The standby period is provided to stabilize the voltage at the cathode E2 of the photodiode D before the transition from the initialization period to the light exposure period.

In the light exposure period, the high potential power source voltage Vdd is supplied as the reset signal Rst to the reset line 46, and the high potential power source voltage Vdd is supplied as the light exposure signal Exp to the light exposure line 48. As a result, in each of the unit circuits U, the transistor N3 is on, and the transistor P1 is off. In the light exposure period, leak current according to the amount of light received with each of the photodiodes D flows in the photodiode D in the reverse direction. The leak current lowers the voltage at the cathode E2 of the photodiode D, and the capacitive element C retains the voltage at the cathode E2.

When the readout period starts, the high potential power source voltage Vdd is supplied as the reset signal Rst to the reset line 46, and the low potential power source voltage Vss is supplied as the light exposure signal Exp to the light exposure line 48. As a result, in each of the unit circuits U, the transistor N3 and the transistor P1 are off, so that the current path through which the leak current from the photodiode D flows is disconnected. Thereafter, in the readout period, in each selection period H, the row selection circuit 32 sequentially selects the row of a unit circuit U to be read, sets, among the selection signals Y[m] to be outputted to the M selection lines 22, the level of the selection line 22 to be outputted to the selected row at the active level (high level=Vdd in this example), and sets the levels of the selection signals to be outputted to the selection lines 22 in the other rows at the inactive level (low level=Vss in this example). When the row selection circuit 32 supplies the selection signal Y[m] to the m-th selection line 22, the transistor N1 in the unit circuit U in the m-th row is turned on. As a result, in the unit circuit U in the m-th row, the transistor N2 functions as a source follower circuit, and the voltage at the cathode E2 of the photodiode D from which the threshold voltage of the transistor N2 is subtracted is outputted to the detection line 24.

Figure 5:
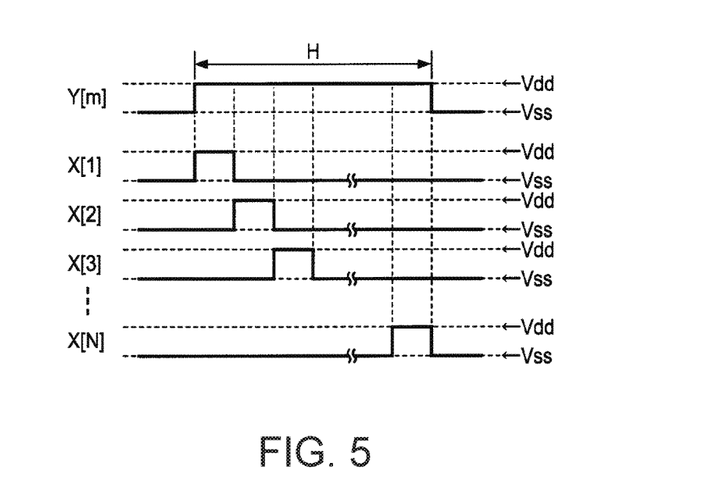
FIG. 5 is a time chart showing the action of a column selection circuit.

In each selection period H, the column selection circuit 38 performs action for capturing voltage from each of the N detection lines 24. FIG. 5 is a time chart showing the action of the column selection circuit 38. In the selection period H in which an arbitrary row is selected by the row selection circuit 32, the column selection circuit 38 sequentially selects the column of a unit circuit U to be read and outputs a control signal X[n] that turns on the transistor N4 in the selected column and turns off the transistors N4 in the other columns, as shown in FIG. 5. The column selection circuit 38 sets the level of the control signal to be outputted to the selected column at the active level (high level=Vdd in this example) and sets the levels of the control signals to be outputted to the other columns at the inactive level (low level=Vss in this example). As a result, when the column selection circuit 38 selects the n-th column, the voltage outputted to the detection line 24 in the n-th column is outputted to the output line 62 via the transistor N4 in the n-th column and supplied to a processing circuit that is not shown.

As described above, according to the present embodiment, when the light exposure period ends, in each of the unit circuits U, the transistor N3 and the transistor P1 are turned off, so that the current path through which leak current from the photodiode D flows is disconnected. Therefore, in the readout period, the amount of light received with the photodiode D in each of the unit circuits U can be accurately detected from the unit circuit U.

The capacitance of the capacitive element C is desirably 10 times the parasitic capacitance of each of the transistor N3 and the transistor P1 or greater. The reason for this is as follows: In the readout period, since the transistor N3 and the transistor P1 are off, no current should flow in the photodiode D. In practice, however, a small amount of current actually flows through the transistor N3 and the transistor P1 also in the readout period, and the electric charge accumulated in the capacitive element C therefore flows into the transistor N3 and the transistor P1 via the photodiode D. As a result, the voltage at the cathode E2 of the photodiode D decreases. However, when the capacitance of the capacitive element C is 10 times the parasitic capacitance of each of the transistor N3 and the transistor P1 or greater, the amount of current that flows into the transistor N3 and the transistor P1 is small in the readout period, whereby the resultant decrease in the voltage at the cathode E2 of the photodiode D decreases. In a case where the photodiode D has the sufficiently large parasitic capacitance described above, the capacitive element C may be omitted. In this case, the photodiode D plays the role of the capacitive element C.

Further, according to the present embodiment, since no leak current is allowed to flow in the photodiodes D when the light exposure period ends, the amount of light received with the photodiode D can be accurately detected without the effect of the leak current even in a situation in which the light exposure period is so adjusted as to be short.

Second Embodiment

Figure 6:
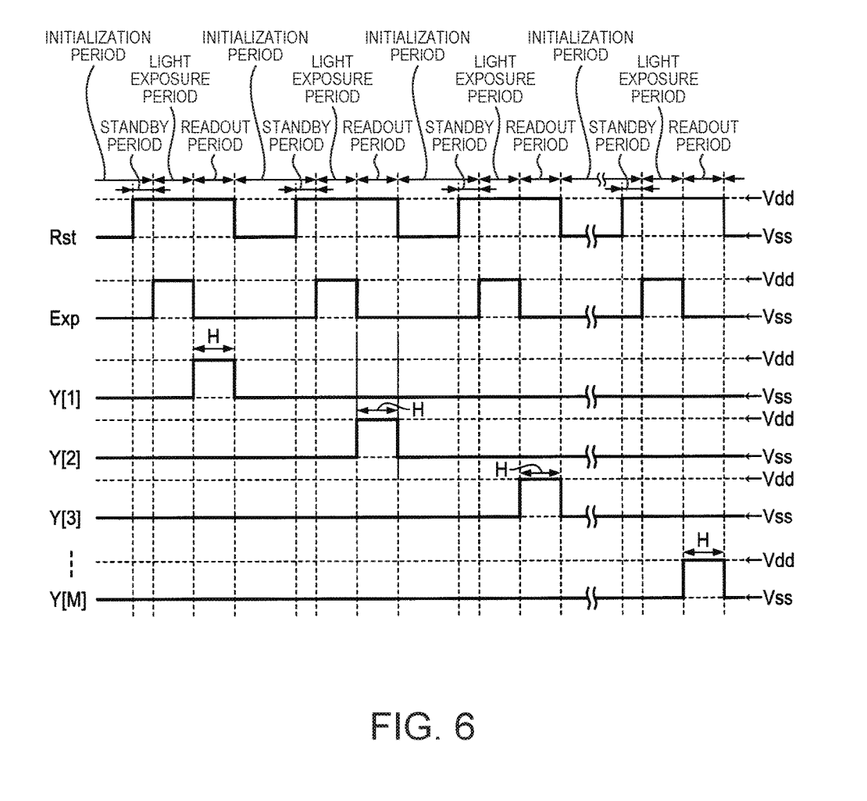
FIG. 6 is a time chart showing the action of an imaging device according to a second embodiment.

An imaging device 18 according to a second embodiment of the invention has the same configuration as that of the imaging device 18 according to the first embodiment. The imaging device 18 according to the present embodiment differs from the imaging device 18 according to the first embodiment only in terms of action thereof. FIG. 6 is a time chart showing the action of the imaging device according to the present embodiment. In the present embodiment, the set of the initialization period (including standby period), the light exposure period, and the readout period is repeated multiple times equal to the number of rows of the unit circuits U, while the row of a unit circuit U to be read is switched to another, for example, in response of the user's imaging instruction, as shown in FIG. 6. Further, in each readout period, the row selection circuit 32 sets, among the selection signals Y[1] to Y[M], the level of only the selection signal for selecting a row to be read at the active level (high level=Vdd in this example) and sets the levels of the selection signals for selecting the other rows at the inactive level (low level=Vss in this example). The action of the column selection circuit 38 in the selection period H for which the row selection circuit 32 selects an arbitrary m-th row is the same as the action in the first embodiment (see FIG. 5).

The operation in which a row is sequentially selected from the first row to the M-th row in each readout period and the electric charge is read from the unit circuit U in the selected row undesirably causes a longer time lag from the end timing of the light exposure period to the readout timing in the unit circuit U in a row selected at a later point of time. Due to the time lag, the voltage of the cathode E2 of the photodiode D lowers. It is therefore difficult to accurately detect the amount of light received with the photodiode D depending on the length of the time lag. In the present embodiment, however, since the row selection circuit 32 selects only one row in each readout period, the time lag from the end timing of the light exposure period to the readout timing does not increase. Therefore, for example, even in a case where there are a large number of rows of the unit circuits U, the amount of light received with the photodiode D can be accurately detected from each of the unit circuits U.

The embodiments of the invention have been described above, and embodiments other than the above embodiments are conceivable, for example, as follows.

(1) In each of the embodiments described above, the standby period is provided in each initialization period, but the standby period may not be provided. In this case, however, when the initialization period ends and the light exposure period starts, a delay between the rise of the light exposure signal Exp from the low potential power source voltage Vss to the high potential power source voltage Vdd and the rise of the reset signal Rst from the low potential power source voltage Vss to the high potential power source voltage Vdd causes a situation in which both the transistor P1 and the transistor N3 are on to occur during the delay, possibly resulting in short-circuit current flowing from the first power source line 44 to the second power source line 42 or vice versa. Therefore, in the case where no standby period is provided, the circuit design needs to be so made that there is no delay between the rise of the light exposure signal Exp from the low potential power source voltage Vss to the high potential power source voltage Vdd and the rise of the reset signal Rst from the low potential power source voltage Vss to the high potential power source voltage Vdd at the start of the light exposure period.

(2) In each of the embodiments described above, no transistor N2 may be present. In this case, the source of the transistor N1 is connected to the detection line 24, and the drain of the transistor N1 is connected to the cathode E2 of the photodiode D. Therefore, in this case, the voltage of the cathode E2 of the photodiode D is outputted to the detection line 24.

(3) In each of the embodiments described above, no transistor N1 may be present. In this case, each of the unit circuits U heeds to be provided with a dedicated detection line 24 and transistor N4.

(4) In each of the embodiments described above, the capacitance element C has one electrode connected to the cathode E2 of the photodiode D and the other electrode connected to the second power source line 42. Instead, the one electrode may be connected to the cathode E2 of the photodiode D, and the other electrode may be connected to an external power source that supplies fixed voltage different from the high potential power source voltage Vdd. The voltage supplied by the external power source may be voltage equal to the low potential power source voltage Vss. Also in this case, in each initialization period but before the standby period, the transistor N3 is off, and the transistor P1 is on, so that the photodiode D is so initialized as to have predetermined potential. Thereafter, the light exposure period elapses, and the voltage according to the amount of light received in the light exposure period can therefore be read from the photodiode D. Further, the external power source may be the power source circuit 34. For example, the power source circuit 34 may produce not only the high potential power source voltage Vdd and the low potential power source voltage Vss but also intermediate voltage Vce representing a voltage value intermediate between the high potential power source voltage Vdd and the low potential power source voltage Vss, and the capacitance element C may have one electrode connected to the cathode E2 of the photodiode D and the other electrode receiving the intermediate voltage Vce from the power source circuit 34. Also in this case, in each initialization period but before the standby period, the transistor N3 is off, and the transistor P1 is on, and the photodiode D is so initialized as to have predetermined potential. Thereafter, the light exposure period elapses, and the voltage according to the amount of light received in the light exposure period can therefore be read from the photodiode D.

(5) In each of the embodiments described above, the transistor N3 is an N-channel transistor but may instead be a P-channel transistor, which is a transistor having a different conductivity type. In this case, however, in each initialization period (including standby period) and the readout period, the high potential power source voltage Vdd is supplied as the light exposure signal Exp to the light exposure line 48, and in the following light exposure period, the low potential power source voltage Vss is supplied as the light exposure signal Exp to the light exposure line 48. In this case, the reset signal Rst is the same as the reset signal Rst in each of the embodiments described above. Further, in each of the embodiments described above, the transistor P1 is a P-channel transistor but may instead be an N-channel transistor, which is a transistor having a different conductivity type. In this case, however, in each initialization period but before the standby period, the high potential power source voltage Vdd is supplied as the reset signal Rst to the reset line 46, and in the following standby period, light exposure period, and readout period, the low potential power source voltage Vss is supplied as the reset signal Rst to the reset line 46. In this case, the light exposure signal Exp is the same as the light exposure signal Exp in each of the embodiments described above.

(6) In each of the embodiments described above, the transistor P1 is disposed between the first power source line 44, to which the high potential power source voltage Vdd is supplied, and the photodiode D, but the destination to which the photodiode D is connected via the transistor P1 is not limited to the first power source line 44. For example, the transistor P1 can be disposed between a wiring line to which fixed voltage different from the high potential power source voltage Vdd is supplied and the photodiode D. Similarly, the destination to which the photodiode D is connected via the transistor N3 is not limited to the second power source line 42. For example, the transistor N3 can be disposed between a wiring line to which fixed voltage different from the low potential power source voltage Vss is supplied and the photodiode D. As will be understood from the above description, the first power source line 44, to which the high potential power source voltage Vdd is supplied, is an example of a first wiring line to which first voltage is supplied, and the second power source line 42, to which the low potential power source voltage Vss is supplied, is an example of a second wiring line to which second voltage different from the first voltage is supplied.

(7) The row selection circuit 32, the column selection circuit 38, and the signal output circuit 36 can be embodied in the form of an integrated circuit (IC chip) mounted on the substrate 182 or can instead be each embodied, for example, in the form of a transistor directly formed in the substrate 182.

(8) Biological information that can be measured by the biological information measurement apparatus using the imaging system 100 in each of the embodiments described above is not limited to the information described in each of the embodiments described above (degree of oxygen saturation and blood sugar level). For example, the imaging system 100 according to each of the embodiments described above can also be used to measure the concentration of alcohol, a cholesterol value, and other pieces of biological information in the blood flowing through a vein.

(9) The electronic apparatus using the imaging device 18 (imaging system 100) shown in each of the embodiments described above is not limited to the biological information measurement apparatus shown in the embodiments described above. For example, the imaging device 18 shown in the embodiments described above can be used in a variety of electronic apparatus, such as a digital still camera and a digital camcorder (video camera) that capture still images, video images, and other types of images.

What is claimed is:

1. An imaging system, comprising:
a plurality of unit circuits, wherein each of the plurality of unit circuits includes a respective photodiode;
a reset signal generator configured to selectively provide a reset signal to each of the plurality of unit circuits to control supply of a first voltage to the respective photodiode; and
a light exposure signal generator configured to selectively provide a light exposure signal to each of the plurality of unit circuits to control supply of a second voltage different from the first voltage to the respective photodiode,
wherein, sequentially for each of the plurality of unit circuits,
the reset signal generator is configured to control the reset signal to supply the first voltage to the respective photodiode in a first period,
the light exposure signal generator is configured to control the light exposure signal to supply the second voltage to the respective photodiode in a second period subsequent to the first period, and the light exposure signal generator is configured to control the light exposure signal to not supply the second voltage to the respective photodiode in a third period subsequent to the second period.

2. The imaging system of claim 1, wherein each of the plurality of unit circuits includes:
a first transistor configured to selectively provide the first voltage to the respective photodiode in response to the reset signal; and
a second transistor configured to selectively provide the second voltage to the respective photodiode in response to the light exposure signal.

3. The imaging system of claim 2, wherein, in the first period, the first transistor is turned on and the second transistor is turned off to initialize the respective photodiode using the first voltage.

4. The imaging system of claim 3, wherein, in the second period, the first transistor is turned off and the second transistor is turned on to provide the second voltage and a leak current to the respective photodiode, wherein the leak current corresponds to an amount of light received.

5. The imaging system of claim 4, wherein, in the third period, each of the first transistor and the second transistor is turned off to disconnect the respective photodiode from the leak current to read an output of the respective photodiode.

6. The imaging system of claim 5, wherein the first period includes a fourth period and wherein, in the fourth period, the first transistor is turned off prior to turning on the second transistor in the second period.

7. The imaging system of claim 1, wherein the first period, the second period, and the third period are repeated for each of the plurality of unit circuits.

8. The imaging system of claim 7, further comprising a row selection circuit configured to control a selection signal to, during the third period, (i) activate a selected row of the plurality of unit circuits to read an output of the respective photodiode and (ii) deactivate remaining unselected rows of the plurality of unit circuits.

9. A biological information measurement device comprising the imaging system of claim 1.

10. An imaging method for an imaging device including a plurality of unit circuits each including a respective photodiode, the method comprising:
selectively providing a reset signal to each of the plurality of unit circuits to control supply of a first voltage to the respective photodiode; and
selectively providing a light exposure signal to each of the plurality of unit circuits to control supply of a second voltage different from the first voltage to the respective photodiode, wherein, providing the reset signal and the light exposure signal includes, sequentially for each of the plurality of unit circuits,
controlling the reset signal to supply the first voltage to the respective photodiode in a first period,
controlling the light exposure signal to supply the second voltage to the respective photodiode in a second period subsequent to the first period, and
controlling the light exposure signal to not supply the second voltage to the respective photodiode in a third period subsequent to the second period.

11. The imaging method of claim 10, further comprising:
using a first transistor, selectively provide the first voltage to the respective photodiode in response to the reset signal; and
using a second transistor, selectively providing the second voltage to the respective photodiode in response to the light exposure signal.

12. The imaging method of claim 11, further comprising, in the first period, turning on the first transistor and turning off the second transistor to initialize the respective photodiode using the first voltage.

13. The imaging method of claim 12, further comprising, in the second period, turning off the first transistor and turning on the second transistor to provide the second voltage and a leak current to the respective photodiode, wherein the leak current corresponds to an amount of light received.

14. The imaging method of claim 13, further comprising, in the third period, turning off each of the first transistor and the second transistor to disconnect the respective photodiode from the leak current and reading an output of the respective photodiode.

15. The imaging method of claim 14, wherein the first period includes a fourth period and further comprising, in the fourth period, turning off the first transistor prior to turning on the second transistor in the second period.

16. The imaging method of claim 10, further comprising repeating the first period, the second period, and the third period for each of the plurality of unit circuits.

17. The imaging method of claim 16, further comprising controlling a selection signal to, during the third period, (i) activate a selected row of the plurality of unit circuits to read an output of the respective photodiode and (ii) deactivate remaining unselected rows of the plurality of unit circuits.

18. The imaging method of claim 10, wherein the imaging method is performed using a biological information measurement device.

* * * * *